United States Patent
Ciplickas et al.

(10) Patent No.: US 7,395,518 B2
(45) Date of Patent: Jul. 1, 2008

(54) BACK END OF LINE CLONE TEST VEHICLE

(75) Inventors: Dennis J. Ciplickas, San Jose, CA (US); Christopher Hess, San Ramon, CA (US)

(73) Assignee: PDF Solutions, Inc., San Jose, CA (US)

( * ) Notice: Subject to any disclaimer, the term of this patent is extended or adjusted under 35 U.S.C. 154(b) by 197 days.

(21) Appl. No.: 10/504,898

(22) PCT Filed: Feb. 27, 2003

(86) PCT No.: PCT/US03/05959
§ 371 (c)(1),
(2), (4) Date: Aug. 18, 2004

(87) PCT Pub. No.: WO03/075190
PCT Pub. Date: Sep. 12, 2003

(65) Prior Publication Data
US 2005/0086617 A1    Apr. 21, 2005

Related U.S. Application Data

(60) Provisional application No. 60/360,304, filed on Feb. 28, 2002.

(51) Int. Cl.
*G06F 17/50*    (2006.01)
*G06F 19/00*    (2006.01)
*G01R 31/308*   (2006.01)
*G01R 31/02*    (2006.01)
*H01L 21/00*    (2006.01)

(52) U.S. Cl. .................. 716/4; 324/753; 324/763; 700/121; 438/11; 438/12

(58) Field of Classification Search .............. 716/1, 716/2, 4, 5; 324/753, 763; 700/121; 438/11–12
See application file for complete search history.

(56) References Cited

U.S. PATENT DOCUMENTS 3,983,479 A    9/1976   Lee et al.
4,855,253 A    8/1989   Weber (Continued)

FOREIGN PATENT DOCUMENTS

JP    02-051245 A    2/1990

OTHER PUBLICATIONS

Sayah, Hoshyar R. & Buehler, Martin G., Comb/ Serpentine/ Cross-Bridge Test Structure for Fabrication Process Evaluation, 1988 IEEE Proceedings on Microelectric Test Structures, vol. 1, No. 1, Feb. 1988.

*Primary Examiner*—Stacy Whitmore
(74) *Attorney, Agent, or Firm*—Duane Morris LLP; Steven E. Koffs

(57) ABSTRACT

A test vehicle comprises at least one product layer having a east one product circuit pattern on the product layer, and one or more clone layers formed over the product layer (1902). The one or more clone layers include a plurality of structures, which may include clone test vehicle circuit patterns and/or clone test vehicle vias (1902). The presence of one or more defects (1904) in the one or more clone layers (1908) is an indicator of a tendency of the product circuit pattern to impact yield of a succeeding layer to be formed over the product circuit pattern in a product (1910).

30 Claims, 16 Drawing Sheets

U.S. PATENT DOCUMENTS

| | | | |
|---|---|---|---|
| 5,051,690 A | 9/1991 | Maly et al. | |
| 5,347,465 A * | 9/1994 | Ferreri et al. | 716/19 |
| 5,473,948 A * | 12/1995 | Moss et al. | 73/861.25 |
| 5,602,492 A * | 2/1997 | Cresswell et al. | 324/763 |
| 5,646,870 A * | 7/1997 | Krivokapic et al. | 716/4 |
| 6,261,956 B1 | 7/2001 | Sheilds | |
| 6,427,222 B1 | 7/2002 | Shau | |
| 6,433,561 B1 | 8/2002 | Satya et al. | |
| 6,445,199 B1 | 9/2002 | Satya et al. | |
| 6,479,342 B1 | 11/2002 | Inaba | |
| 6,509,197 B1 | 1/2003 | Satya et al. | |
| 6,518,591 B1 | 2/2003 | Shamble et al. | |
| 6,614,049 B1 * | 9/2003 | Koyama | 257/48 |
| 6,795,952 B1 * | 9/2004 | Stine et al. | 716/5 |
| 6,834,375 B1 * | 12/2004 | Stine et al. | 716/2 |
| 2003/0097228 A1 * | 5/2003 | Satya et al. | 702/82 |
| 2005/0085932 A1 * | 4/2005 | Aghababazadeh et al. | 700/90 |
| 2005/0090027 A1 * | 4/2005 | Aghababazadeh et al. | 438/17 |
| 2005/0112474 A1 * | 5/2005 | Sandstrom | 430/5 |

* cited by examiner

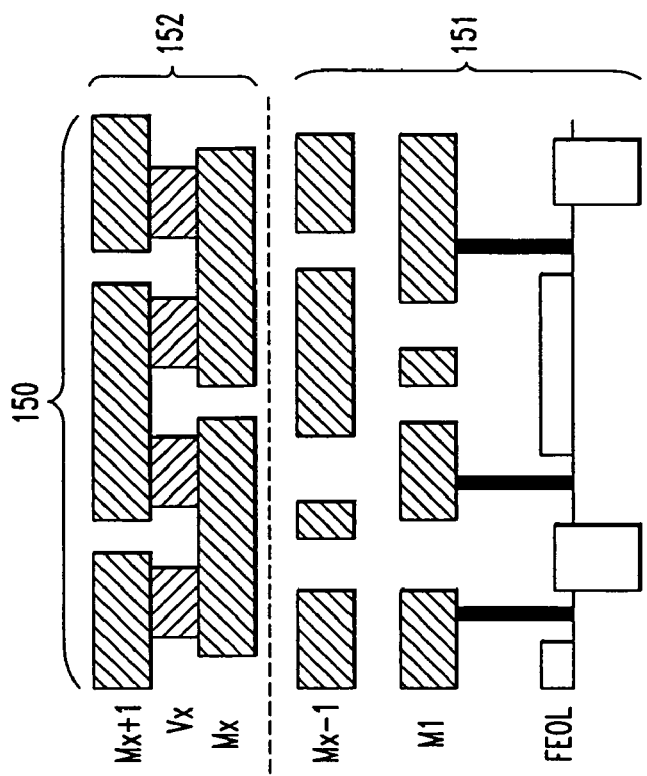
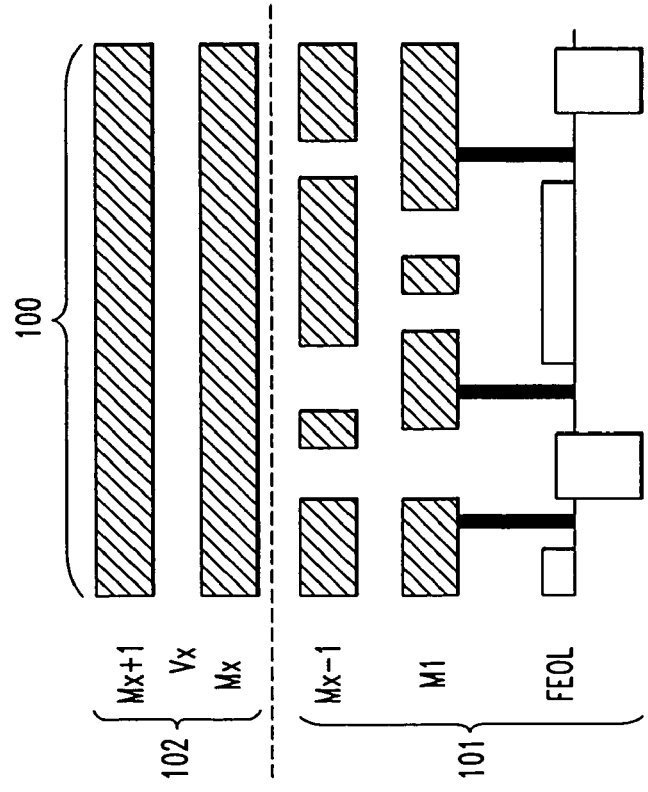

| MDA | VSA | MSB | VDB |
|-----|-----|-----|-----|
| VWA | MWA | PRODUCT | MWB |
| MSA | VDA | MDB | PRODUCT |

MS

MW

MD

VWA

VSA

VDA

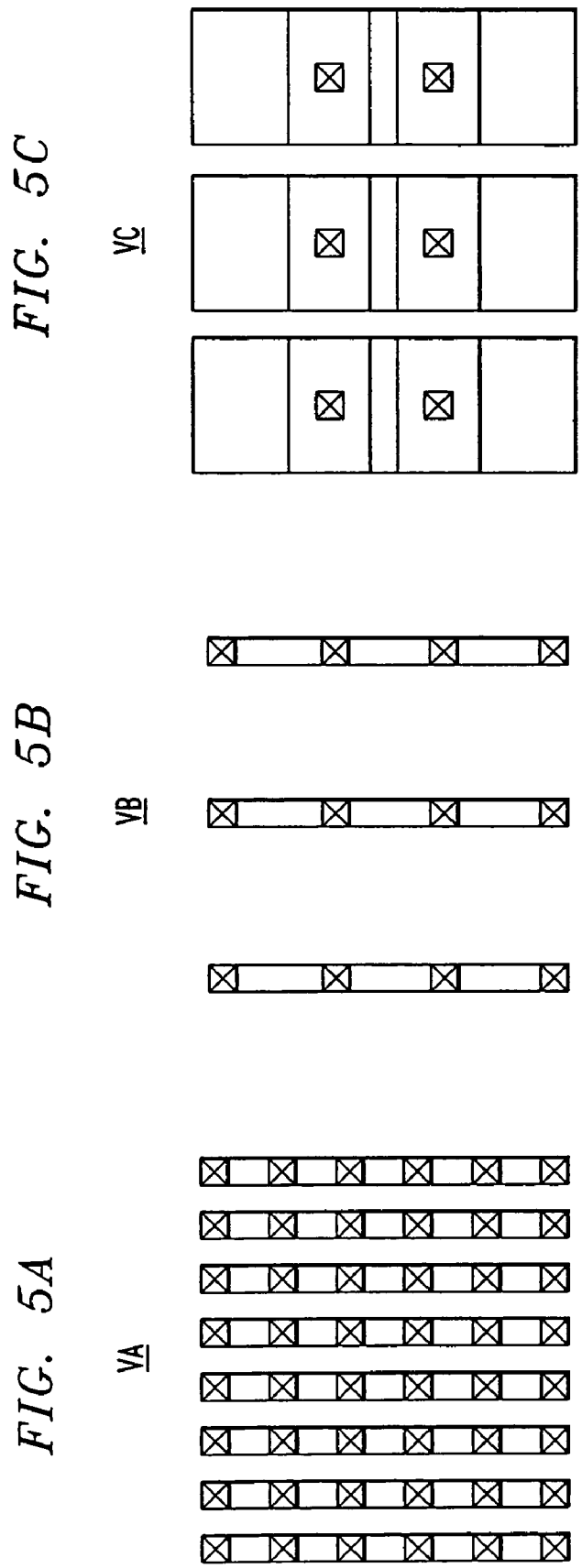

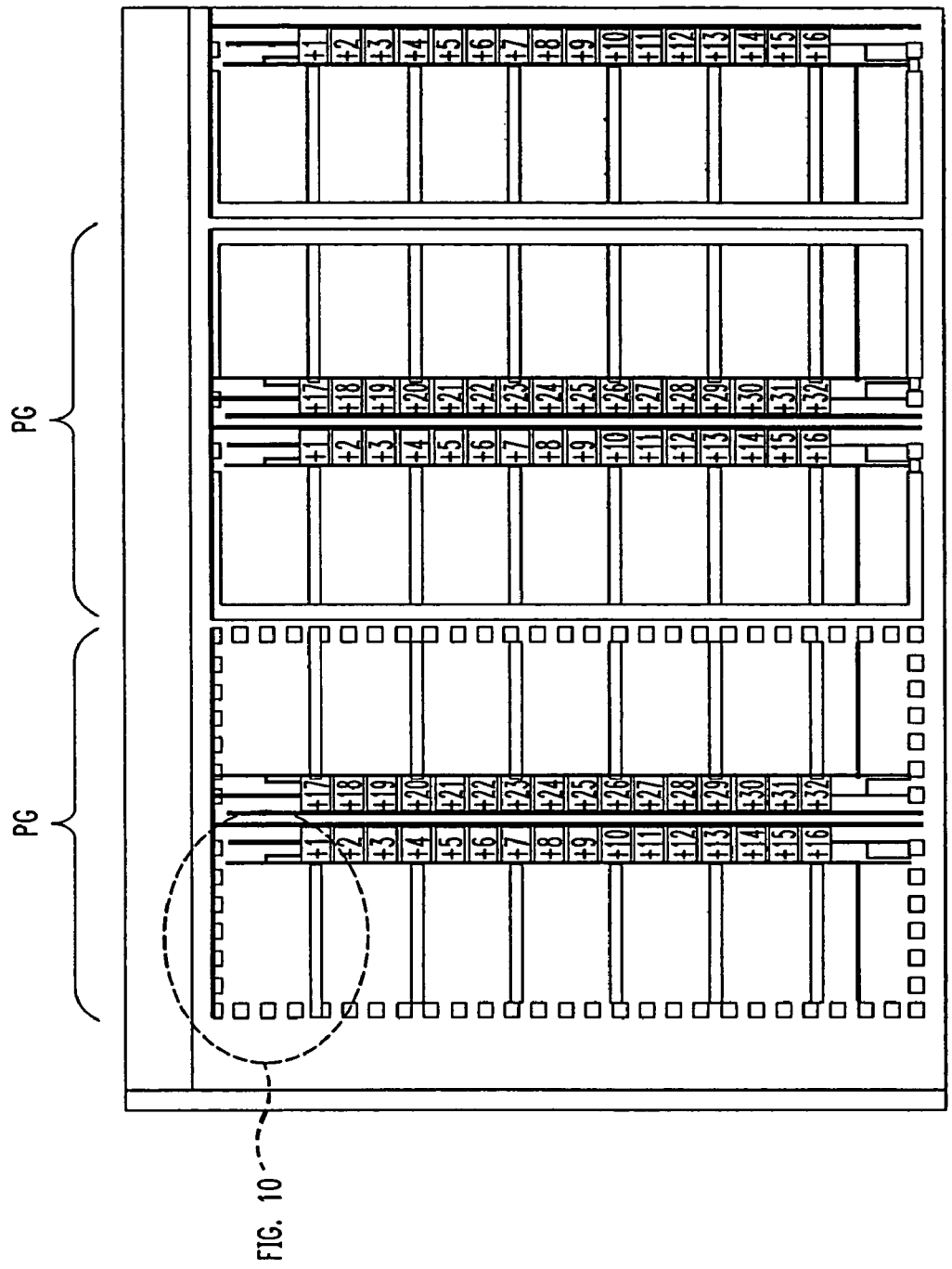

BACK END OF LINE CLONE TEST VEHICLE

This application claims the benefit of U.S. Provisional Patent Application 60/360,304, filed Feb. 28, 2002, which is incorporated by reference herein in its entirety.

FIELD OF THE INVENTION

The present invention fabrication of integrated circuits generally, and more specifically to methods of characterizing defects that impact wafer yield, and their causes.

BACKGROUND OF THE INVENTION

In the past two decades, sophisticated systems have evolved in the techniques to evaluate defects that affect the yield of integrated circuits. These systems include yield models generated in conjunction with the design of test vehicles (TV) that facilitate both yield prediction and yield enhancement of an integrated circuit manufacturing process. Except for the measurement of contact yields, (short flow) TV structures are utilized to evaluate defects on a single level.

In the case of full flow TV's, the prior art does not disclose how to identify the detailed interaction of defects in adjacent (vertical) levels through the results of electrical testing. For the case of the identification of defects on a single layer through optical and/or scanning electron microscope (SEM) inspection techniques it is difficult to predict what artifacts discovered on an inspected layer might produce killer defects in the next layer above it. That is, such inspection methods attempt to identify killer defects within the layer that is inspected.

U.S. Provisional Patent Application No. 60/316,317, filed Aug. 31, 2001, which is incorporated by reference herein in its entirety, addressed the design of TV's which characterize the interaction of feature induced defects within adjacent (vertical) layers related to the Copper damascene chemical mechanical polishing (CMP) processing geometries.

It is desirable that the next generation of yield models with yield predictive capabilities take into account the yield impact of the interaction of structural artifacts within multi-level process layers.

SUMMARY OF THE INVENTION

One aspect of the present invention is a test vehicle, comprising at least one product layer having at least one product circuit pattern thereon, and one or more clone layers formed over the product layer. The one or more clone layers include a plurality of structures from the group consisting of clone test vehicle circuit patterns and clone test vehicle vias. The presence of one or more defects in the one or more clone layers is an indicator of a tendency of the product circuit pattern to impact yield of a succeeding layer to be formed over the product circuit pattern in a product.

Another aspect of the invention is a method for designing or fabricating a plurality of different test vehicles, in which the improvement comprises designing or fabricating the plurality of test vehicles, so that: each test vehicle has a respectively different product layer having at least one product circuit pattern thereon; each test vehicle has one or more clone layers over the product layer, the one or more clone layers including a plurality of structures from the group consisting of clone test vehicle circuit patterns and clone test vehicle vias; and the one or more clone layers used for each of the plurality of different test vehicles are the same or substantially the same.

Another aspect of the invention is a method for analyzing a plurality of circuit patterns. A first clone layer is formed over a product layer. The first clone layers include a plurality of structures from the group consisting of clone test vehicle circuit patterns and clone test vehicle vias. A determination is made whether one or more defects are present in the first clone layer caused by artifacts in the product layer. A second clone layer is formed over the first clone layer. A determination is made whether one or more defects are present in the second clone layer caused by artifacts in the product layer or the first clone layer.

BRIEF DESCRIPTION OF THE DRAWINGS

FIG. 1A is a cross sectional view of a portion of a back end of line (BEOL) clone TV including metal checks.

FIG. 1B is a cross sectional view of a portion of a back end of line (BEOL) clone TV including via checks.

FIG. 2 shows the floorplan of an exemplary BEOL clone TV having 12 different chips per field.

FIGS. 5A-5C show three via test cells having respectively different combinations of metal density and via density in straight line connecting patterns.

DETAILED DESCRIPTION

Figure 3C:
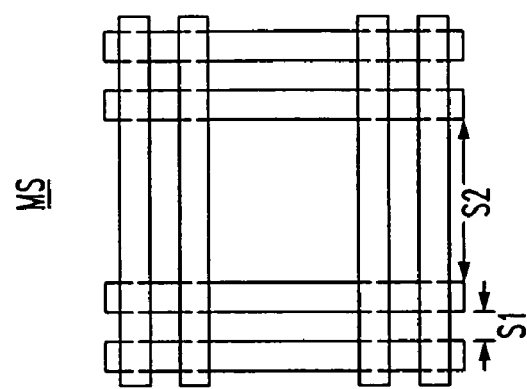
FIGS. 3A-3C show three combinations of metal patterns having different metal density and line width.

The exemplary method pertains to the fabrication of integrated circuits, and more particularly to methods that characterize and quantify classes of structural features that propagate defects through their interaction with an adjacent (vertical) layer within the multi-levels of integrated circuit structures. The example provides a gateway to three-dimensional measurements of structures in a circuit pattern that result in killer defects ill subsequently deposited pattern layers.

This exemplary method uses geometrical pattern variables of one level (the "clone layer") that interact with an actual product layer immediately below the clone layer. This technique can identify specific structural features ("aggressors") of the product layer that can induce defects into a given susceptible geometrical pattern contained in the TV clone layer variables. In some cases, an artifact in the product layer may not be measurable in a single-layer test vehicle, but the same artifact can be measured indirectly through the induced defect in the clone layer above the artifact.

An example is described below which produces a design of short flow TVs that can address the effect of a multitude of structural features contained in the BEOL (product) metal layers and vias that can create defects within a multitude of possible geometrical cases in the layer above it. In general, these and other TVs may also use TV designs with electrical test capability to evaluate and quantify classes of structural features on a given product layer that give rise to defects on the next process layer. The resulting information, derived from the testing of the TV (concomitant with a physical inspection of the identified defect with respect to its location), can be used to produce a yield model and yield prediction system in the case of such interactions, for any desired two layer interconnection sequence within a given multi-layer integrated circuit structure.

FIGS. 1A and 1B show cross sectional views of a portion of an exemplary BEOL clone TV. FIG. 1A shows a BEOL clone 100 TV having TV metal checks. FIG. 1B shows a BEOL clone TV 150 having TV via checks. The exemplary BEOL clone TV is used to evaluate impact of BEOL product topography on open/short yield of subsequent BEOL layers. A test chip overlay is built for product wafers. In the diagrams of FIGS. 1A and 1B, BEOL (front end of line), M1 and Mx−1 are layers (the "product layers") 101, 151 deposited in the copper (Cu) damascene process for an actual product. The layers designated Mx, Vx and Mx+1 are BEOL clone patterns 102, 152, described in detail below. The first group of patterns Mx, Vx and Mx+1 101, 151 are formed using the related semiconductor product fabrication processes. The clone patterns 102, 152 are fabricated using the same BEOL fabrication processes used for the same product. But the clone layer patterns 102, 152 are designed to enable identification and analysis of how the presence of specific product circuit patterns in the M1 and Mx−1 layers cause artifacts in layers deposited over the product patterns.

The overlay can be used to diagnose major Cu interconnection topography issues. For example, the overlay is used to study iso/dense and narrow/wide pattern effects in both via and metal structures. The term "iso/dense" means that certain patterns are isolated (with no nearby neighborhood) and dense means that there is a dense neighborhood pattern environment. This technique enables fast cycle time in fabrication of the test vehicle. Product lots are split before any via (Vx) fabrication processes are performed. Faults are localized. Preferably, the product layout is partitioned into independent test cell regions, over which corresponding clone TV regions can be fabricated to determine the effects of the product patterns on the specific structures in the clone layers. For example, approximately 300 μm-by-300 μm test cell regions may be used in the clone layers for a product field sized approximately 1200 μm-by-900 μm for 12 chips in a 4 by 3 array. To optimize test time vs. fault localization, one of ordinary skill can readily identify the trade-off between cell size vs. padframe count.

As shown in FIG. 1A, the test vehicle 100 comprises at least one product layer (FEOL, M1, Mx−1) 101 having at least one product circuit pattern thereon. One or more clone layers (Mx, Vx, Mx+1) 102 are formed over the product layer 101. Mx and Mx+1 are metal layers containing circuit patterns. Vx is a via layer containing vias connecting patterns in the Mx and Mx+1 layers. The one or more clone layers Mx, Vx, Mx+1 include a plurality of structures from the group consisting of clone test vehicle circuit patterns (metal checks) and clone test vehicle vias.

In FIGS. 1A and 1B, the M1 layer may contain the contacts of the first Cu damascene layer, which are connected by tungsten posts to a circuit pattern below. The Mx−1 layer is the inter-layer dielectric oxide layer (ILD). The clone layers Mx, Vx, Mx+1 are formed on top of the ILD layer. Alternatively, the M1 layer may be the second copper damascene layer, in which case M1 is connected to the metal layer below it by copper filled vias. In the case where M1 is the second copper damascene layer, the Mx−1 layer would also be a dielectric layer. In the example of FIGS. 1A and 1B, the clone TV layers 102, 152 correspond to representative layers of the Cu damascene process, but one of ordinary skill in the art can readily develop clone TV patterns for other BEOL processes.

When a test vehicle is fabricated including the lower (product) layers 101, 151 plus the upper (clone TV) layers 102, 152, the presence of one or more defects in the one or more clone layers is an indicator of a tendency of the product circuit pattern to impact yield of a succeeding layer to be formed over the product circuit pattern in a "real" product. Thus, a product that has the same FEOL, M1 and Mx−1 product layers may be expected to have the same types of artifacts when the normal BEOL layers are deposited thereon as the artifacts detected using the clone TV layers.

An exemplary method for analyzing a circuit pattern comprises the steps of collecting data (through electrical testing) from a test vehicle 100, 150, including at least one product layer 101, 151 having at least one product circuit pattern thereon, and one or more clone layers 102, 152 formed over the product layer, the one or more clone layers including a plurality of structures from the group consisting of clone test vehicle circuit patterns and clone test vehicle vias. A determination is made whether one or more defects are present in the one or more clone layers. This can include identifying one or more specific artifacts in the one or more clone layers.

One can then analyze a tendency of the product circuit pattern to impact yield of a succeeding layer to be formed over the product circuit pattern in a product, based on the determination. This analysis can include identifying a feature or attribute of the product layer that causes the one or more artifacts to propagate into the one or more clone layers. For example, there may be an artifact in the product layer that is not measurable in a short flow test vehicle, because it does not cause a failure in the product layer itself. Nevertheless, the artifact in the product layer can cause a detectable defect in the clone TV layers.

Preferably, the clone TV layers are reusable. The method of fabricating one or more product pattern layers and then forming one or more clone TV layers may be performed for each of a plurality of products, each product having a respective product layer, with the same or substantially the same clone layers being used for each of a plurality of respectively different product layers.

As used herein, clone layers 102, 152 may be considered substantially the same when the clone layers include the same number of regions or chips per field, and the regions in each set of clone layers have the same types of patterns. For example two clone TV floorplans 200 would be considered substantially the same if both have 12 chips per field, including MDA, MDB, MSA, MSB, MWA, MWB, VDA, VDB, VSA, VWA, and two product patterns, as shown in FIG. 2 and described below. The clone layers of the two TV's would be considered substantially the same even though the length and width of the regions differs between the two TV's.

In clone TV layers having substantially the same layout, the clone layers for each of the plurality of test vehicles have common structures (e.g., snakes and combs, zigzag via chains), but may have respectively different clone layer length and clone layer width corresponding to a length and width of the respective product layers.

In clone TV layers having substantially the same layout, the clone layers for each of the plurality of test vehicles may be divided into a plurality of regions arranged in a common layout shared by each test vehicle, with the corresponding regions in the clone layers of each test vehicle having common structures. Thus, the top left region of each clone TV may be an MDA region, and the bottom right region of each clone TV may be a product region, as shown in FIG. 2.

The clone layers of two TV's may also be considered substantially the same if the same subchips are used, but the specific arrangement of the subchips is different in each of the clone TV's. Thus, in the example of FIG. 2, the locations of the MDA and MDB cells (regions) could be interchanged without degrading the information derived from the TV. Other regions could also be interchanges.

Preferably a list of the identified features or attributes of each BEOL clone TV fabricated is stored in a database. This allows one to identify a correlation among the identified features or attributes in the database. As the database is populated by data representing the artifacts measured with the clone TV's, information on the correlation can be fed back to change the design of at the product circuit pattern of at least one of the products. Additionally, the results of fabricating the BEOL clone TVs can be fed back to change a design of the one or more clone layers.

By being able to use the same or substantially the same clone TV floorplan for a plurality of different product layouts, it is possible to make very efficient use of the TV designer's skills, and also to build up a large knowledge base on how the occurrence of a particular defect in the clone TV can be traced back to an underlying artifact in the product layers.

FIG. 2 is a layout of an exemplary clone TV floorplan. In the example, the one or more clone layers Mx, Vx, Mx+1 have a plurality of regions. Each of the regions of the one or more clone layers includes a respective plurality of structures from the group consisting of clone test vehicle circuit patterns and clone test vehicle vias. It is understood that there may be as few as one TV circuit pattern clone layer, if there are no vias being checked in the TV. If there are vias, then there is a metal layer Mx below the via and another metal layer Mx+1 above the via layer.

In the example, there are 12 chips per field in the product reticle, overlying 12 product patterns that are identical to each other. However, any number of one or more chips per field may be present in the product reticle. For example, there may be 4, 8, 16 or 20 chips per field. In the specific example of FIG. 2, the 12 fields are as follows:

MDA and MDB are clone pattern regions with dense metal. As explained further below, regions MDA and MDB of the one or more clone layers have clone test vehicle circuit patterns that are identical to each other but offset from respective region boundaries by different distances, and the padgroups for each of the two regions are positioned in respectively different portions of the region, so as to make artifacts beneath respectively different portions of the region measurable in each of the two regions. This feature may be used to render all areas of product subchip measurable by the TV, as described further below, with reference to FIGS. 9A and 13A.

MWA and MWB are clone pattern regions with wide metal lines, and also include clone TV circuit patterns that are identical to each other but offset from respective region boundaries by different distances. MSA and MSB are clone pattern regions with sparse metal density, and also include clone TV circuit patterns that are identical to each other but offset from respective region boundaries by different distances.

VDA and VDB are clone pattern regions with high via density and high metal density, and also include clone TV circuit patterns that are identical to each other but offset from respective region boundaries by different distances. VSA is a clone pattern region with sparse via density and sparse metal density. VWA is a clone pattern region with sparse via density and high metal density (achieved using wide metal lines).

Lastly, two of the cells are labeled "PRODUCT". In the PRODUCT cells, the BEOL layers of the actual product pattern are formed. This allows correlation between defects observed in the remaining 10 regions and defects observed (or not observed) in the actual product.

Figure 3B:
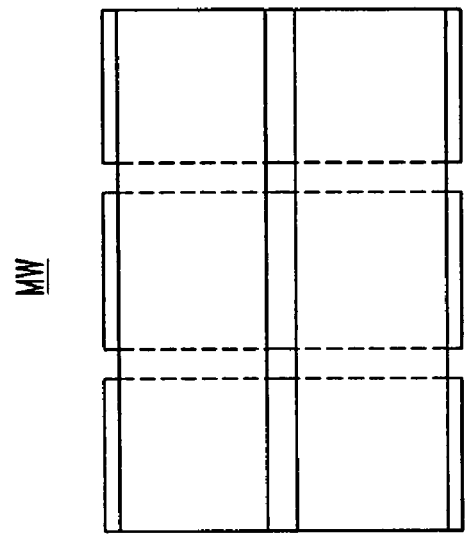
Figure 3A:
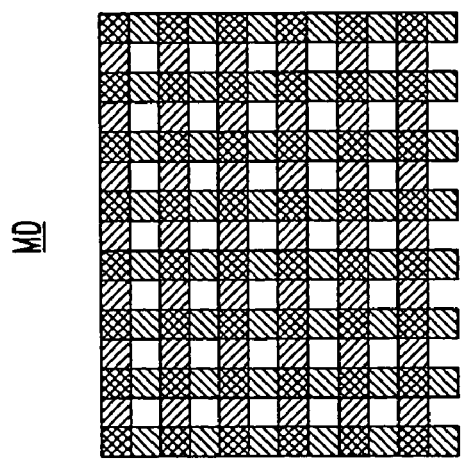

FIGS. 3A-3C show three exemplary patterns that may be formed on the metal layers of the clone TV layers. At least two of the regions in the one or more clone layers include clone test vehicle circuit patterns having respectively different combinations of metal density, line width and line spacing.

The one or more clone layers have at least three regions, including: a first region MDA, MDB with a medium metal density, a minimum line width and a nominal line spacing; a second region MWA, MWB with a maximum metal density, relatively wide lines and a minimum line spacing; and a third region MSA, MSB with a minimum metal density, a minimum line width, and a minimum line spacing.

Clone TV metal patterns explore the interaction of all product underlayer patterns with the nominal and extreme patterns possible on upper metal layers. In FIG. 3A, snakecomb patterns are provided with nominal metal density. The density is 0.50 and the L/S ratio is 0.28/0.28. FIG. 3B shows comb metal patterns with wide lines for high metal density. The density is 98%, and the L/S ratio is 14.0/0.28. FIG. 3C includes snakecomb patterns with sparse density. The density is 0.20, and the ratio of L/S1/S2 is 0.28/0.28/2.0. Although the exemplary clone test vehicle circuit patterns include snakecomb structures, other patterns may be used in the clone metal layers to investigate the three dimensional effect caused by the pattern. For example, it is contemplated that Kelvin and Van der Pauw structures may be used in the clone TV layers for identifying variations in line width in the BEOL layers caused by the FEOL pattern layers.

Figure 4C:
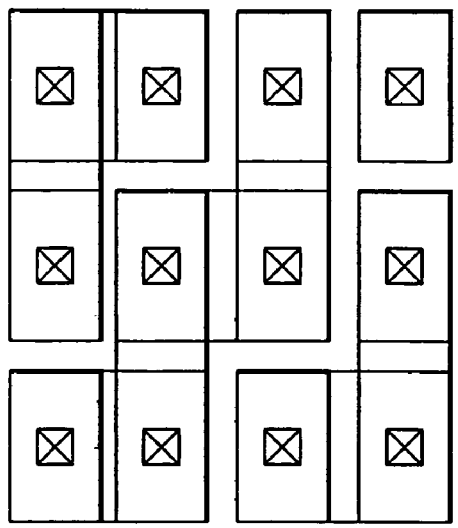
FIGS. 4A-4C show three via test cells having respectively different combinations of metal density and via density in zigzag patterns.
Figure 4B:
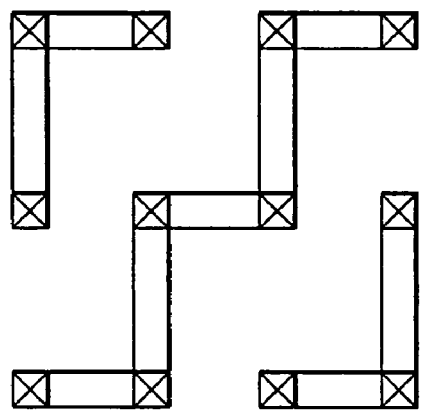
Figure 4A:
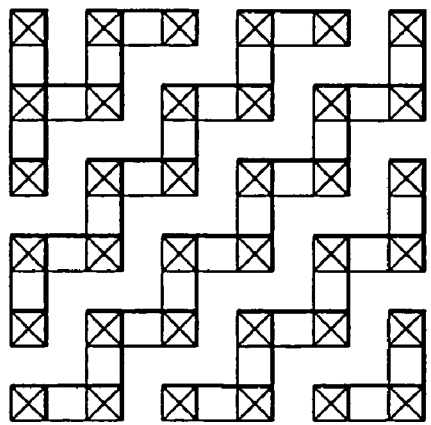

Clone TV via patterns explore the interaction of all product underlayer patterns with the nominal and extreme patterns possible on upper via layers. FIGS. 4A-4C show additional clone patterns that can be used in at least two of the regions in the one or more clone layers include clone test vehicle vias having respectively different combinations of metal density and via density.

In the example, the one or more clone layers have at least three regions (also shown in the floorpan 200, FIG. 2), including: a first region VDA, VDB (FIG. 4A) with a relatively high metal density and a relatively high via density; a second region VSA (FIG. 4B) with a relatively sparse metal density and a relatively sparse via density; and a third region VWA (FIG. 4C) with a relatively high metal density and a relatively sparse via density.

In the example of FIGS. 4A-4C, the clone layers include zigzag via chains, wherein the vertical lines are in one layer, and the horizontal lines are in another layer. Zigzag chains are described in U.S. Provisional Patent Application 60/307,398, which is incorporated by reference herein in its entirety. Although zigzag chains are desirable, alternative metal layers may be used for the metal layers in the via check regions of the clone TV. For example, as shown in FIGS. 5A-5C, the metal layers Mx+1 and Mx above and below the via layer Vx may have all lines in the same direction (as opposed to zigzag). FIG. 5A shows a region VA having dense vias and dense metal. FIG. 5B shows a region VB having sparse vias and sparse metal. FIG. 5C shows a region VC having sparse vias and dense metal.

Figures 6, 7:
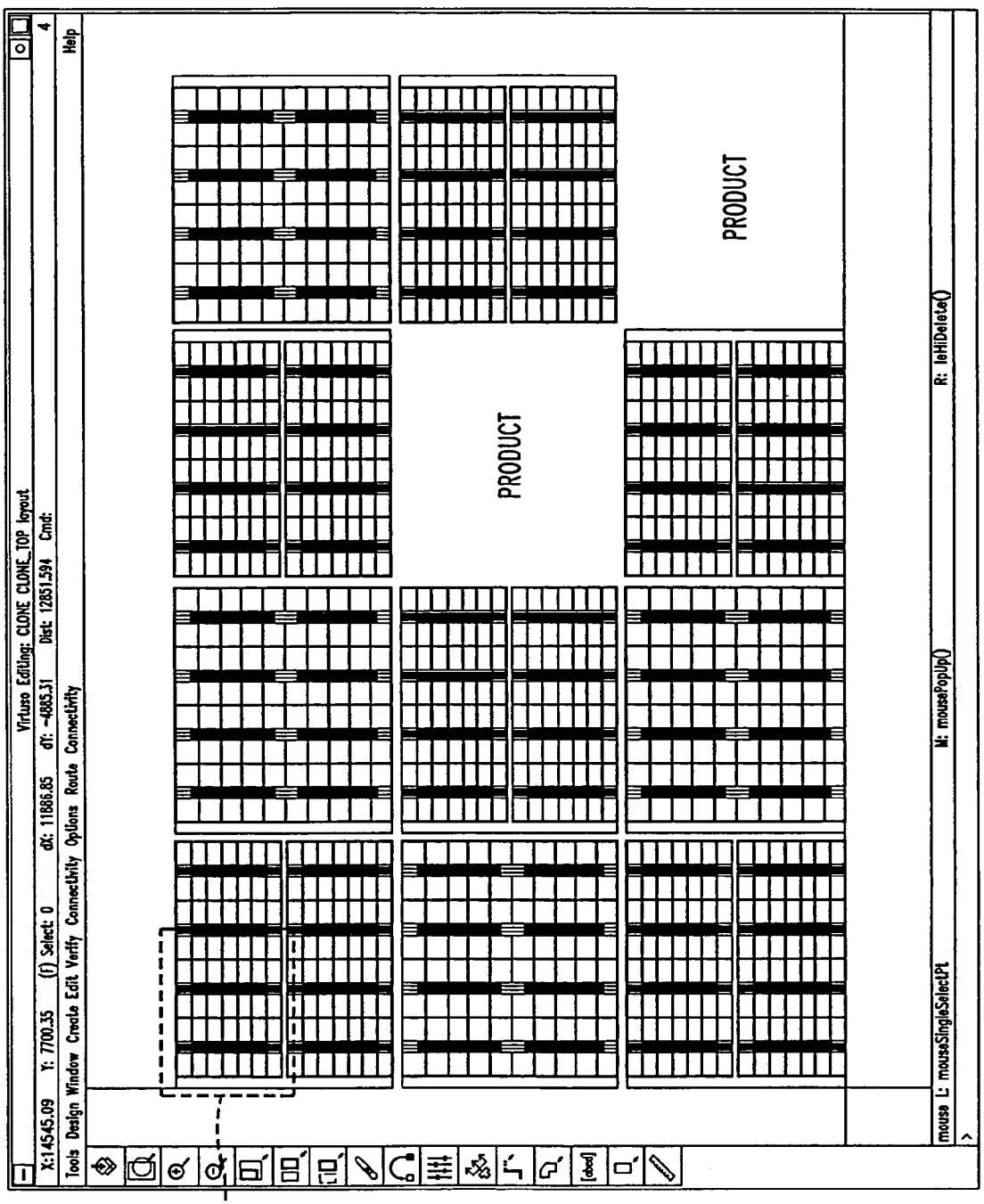
FIG. 6 is a diagram showing the reticle layout corresponding to the floorplan of FIG. 2.
FIGS. 7, 8A and 8B show features of the reticle layout of FIG. 2.

FIG. 6 is a diagram of the clone TV reticle layout image corresponding to the floorplan shown in FIG. 2. FIGS. 7, 8A, 8B, 10-12 and 14-16 show details of the reticle layout image.

FIG. 7 shows two (of eight) padgroups PG from the MDA region shown in FIG. 2. As shown in FIG. 7, each region of a top one of the one or more clone layers has a plurality of identical padgroups PG. The padgroups on the top layer are used for actual electrical tests following fabrication of the TV. Exemplary padgroups PG in FIG. 7 have 5-8 devices under test (DUT) on each side of a 2×16 padframe. This region has a 2×16 array of 100 μm-by-100 μm pads at 120:m pitch. Above and below the pad array is mostly empty space with routing lines to the DUTs. All DUTs within the exemplary padgroups (and sub-chips) are identical.

Figure 8A:
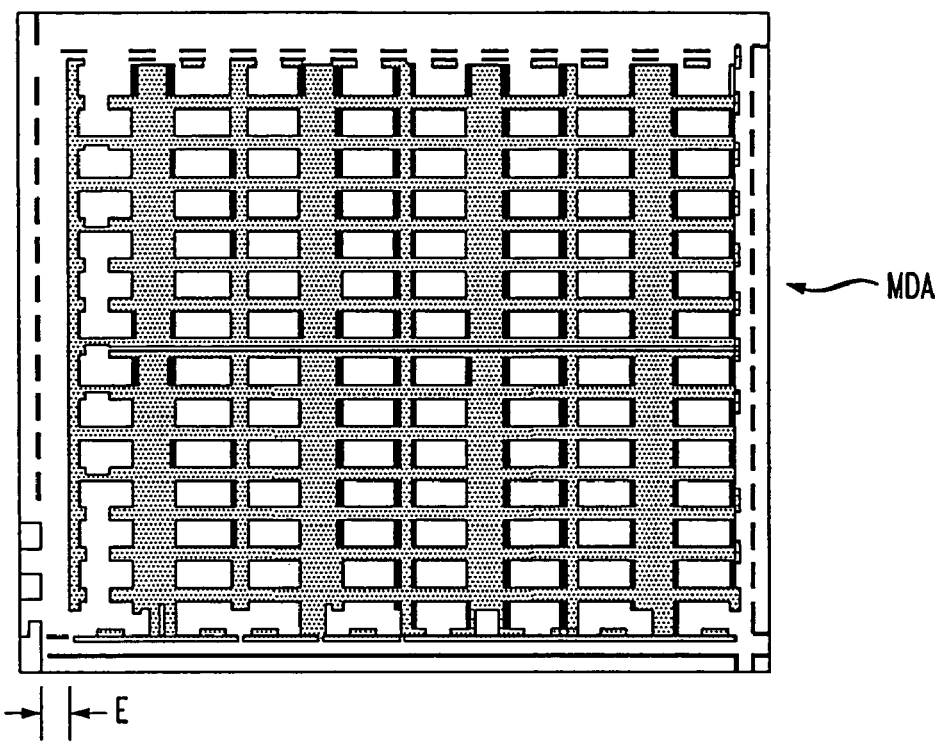
Figure 8B:
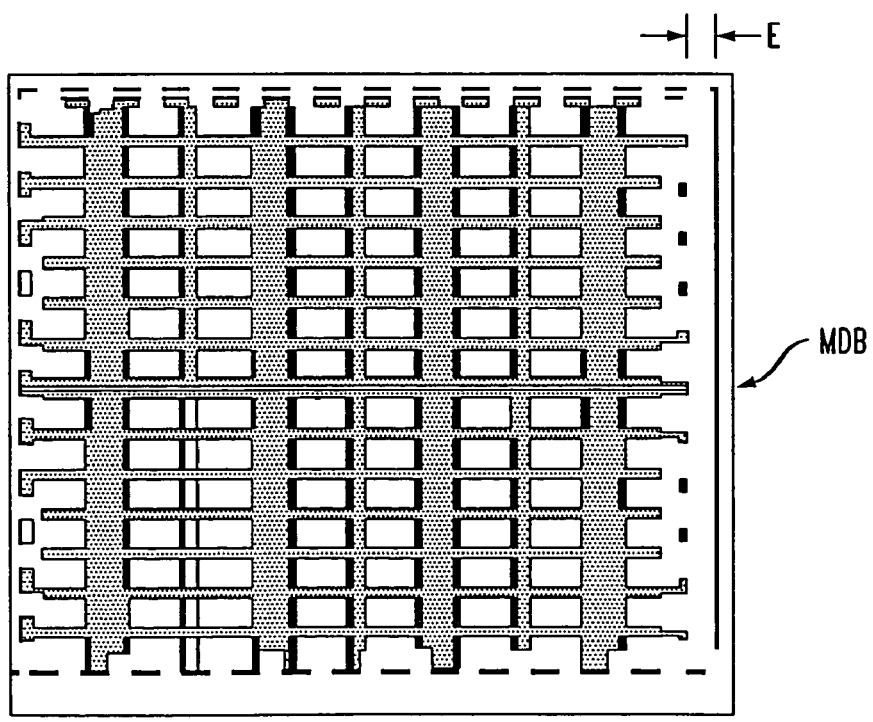
Figure 9C:
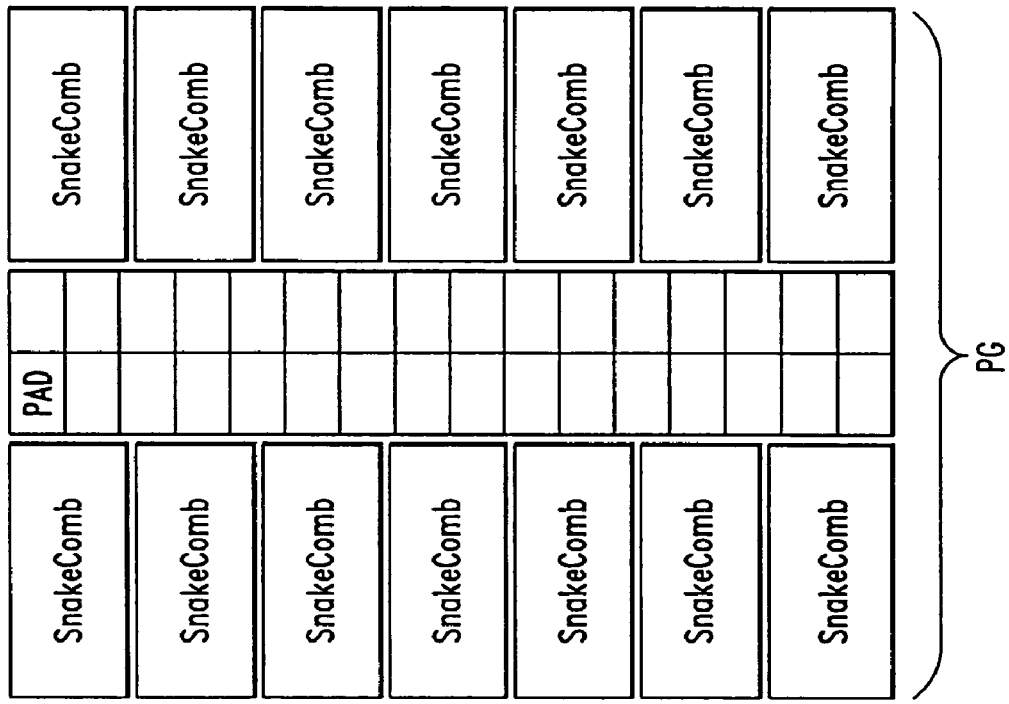
FIG. 9C is an enlarged view of a detail of FIG. 9B.
Figure 9A:
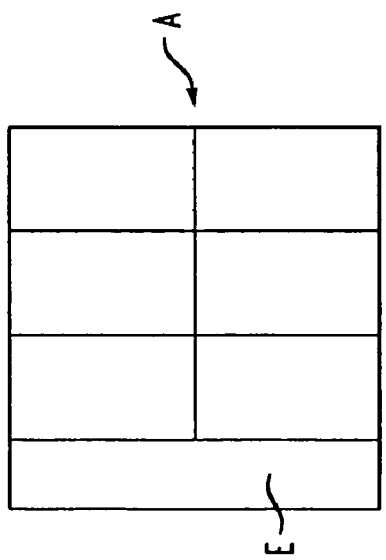
FIGS. 9A and 9B show how the layout of the clone TV metal layer circuit is offset between the sub-chip 1 and sub-chip 2.
Figure 9B:
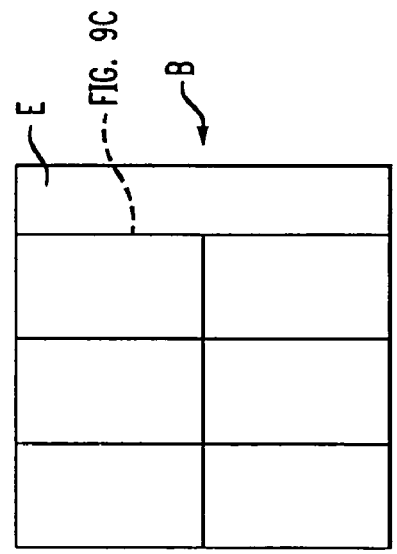
Figure 13C:
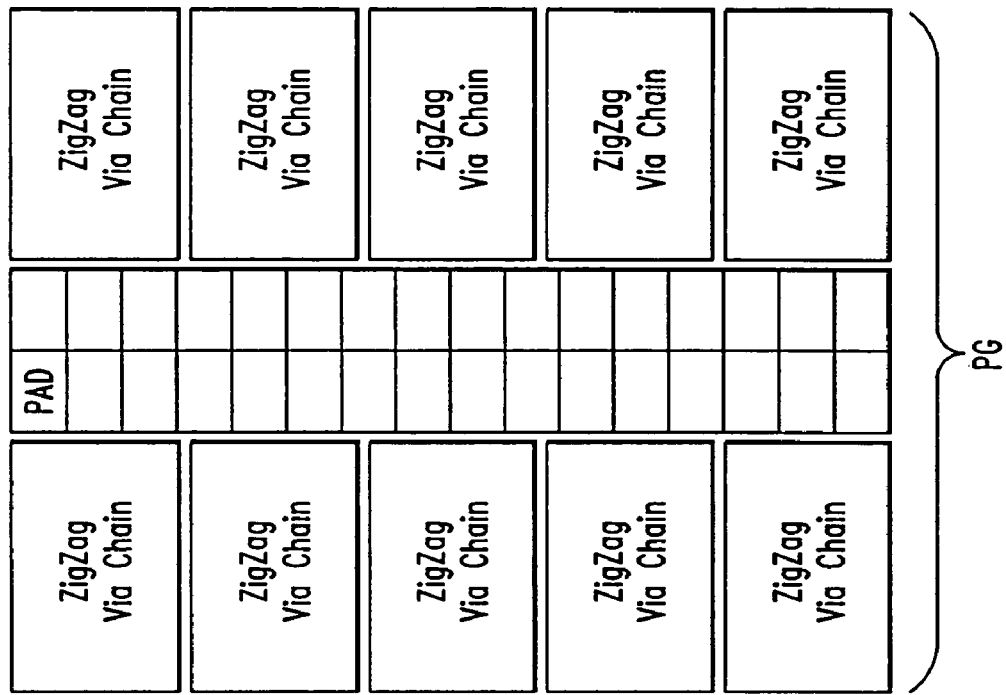
FIG. 13A shows how the layout of the clone TV via layer circuit is offset between the sub-chip 1 and sub-chip 2.
FIG. 13B is an enlarged view of a detail of FIG. 13A.
Figure 13A:
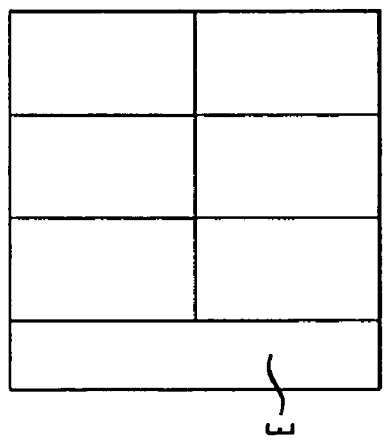
Figure 13B:
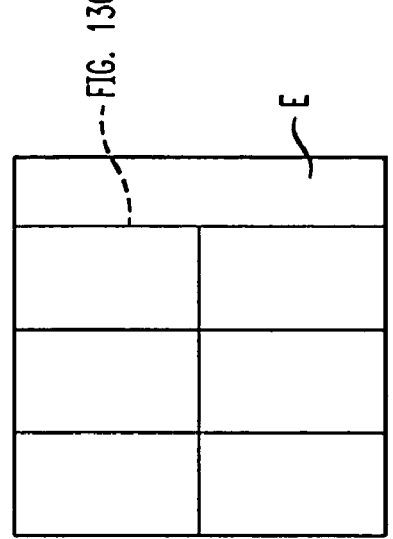

FIGS. 8A, 8B, 9A and 9B show how the A and B type sub-chips are related. FIG. 8A shows a portion of the reticle containing an A-type sub-chip, and FIG. 8B shows a corresponding portion of the reticle containing a B-type sub-chip. FIGS. 9A and 9B are schematic representations of type A and type B regions, respectively. Patterns in A-type and B-type sub-chips are identical, but shifted left/right of each other. A-type chips (e.g., FIG. 8A) have empty space "E" at the LEFT side of the sub-chip. B-type chips (e.g., FIG. 8B) have empty space "E" at the RIGHT side of the sub-chip. Because artifacts in the product pattern beneath the pads cannot be measured in electrical test, the pads in the A and B-type chips are located in different positions relative to the product pattern lying underneath. Defects in some features of the pattern may only be measurable in the A-type chip (because they lie beneath the pads in the B-type chip.) Defects in other features of the pattern may only be measurable in the B-type chip (because they lie beneath the pads in the A-type chip.) By including both types of chip in the floorplan, defects in all parts of the product pattern may be measured. FIGS. 13A and 13B show how the via sub-chip layouts in the A and B regions are related, in the same fashion as the metal layers.

Figure 10:
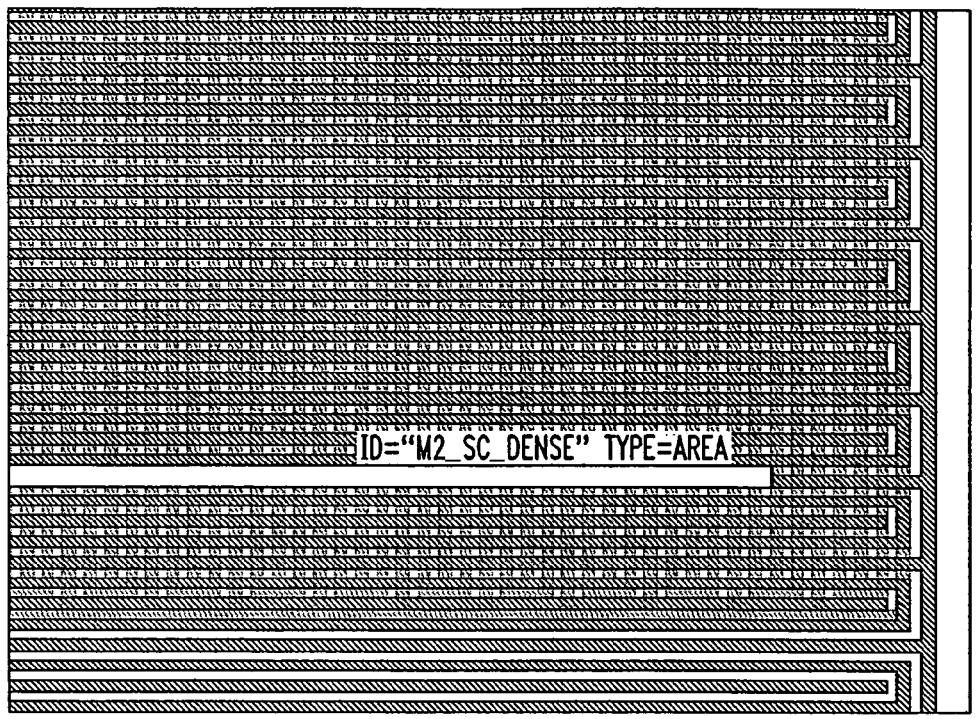
FIGS. 10-12 show enlarged details of the reticle layout of FIG. 2.
Figure 11:
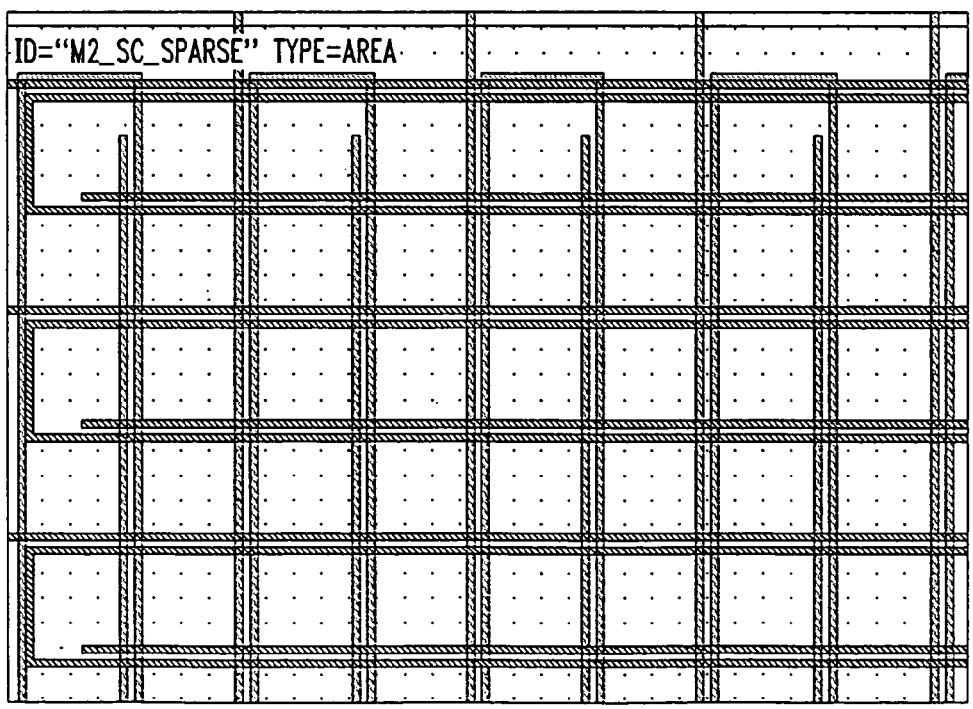
Figure 12:
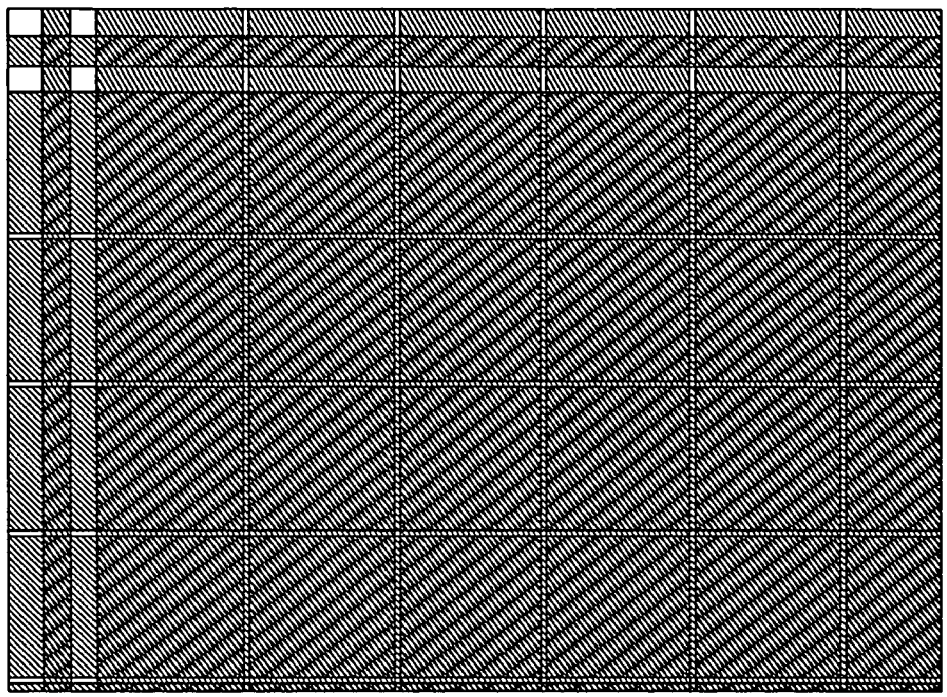
Figure 14:
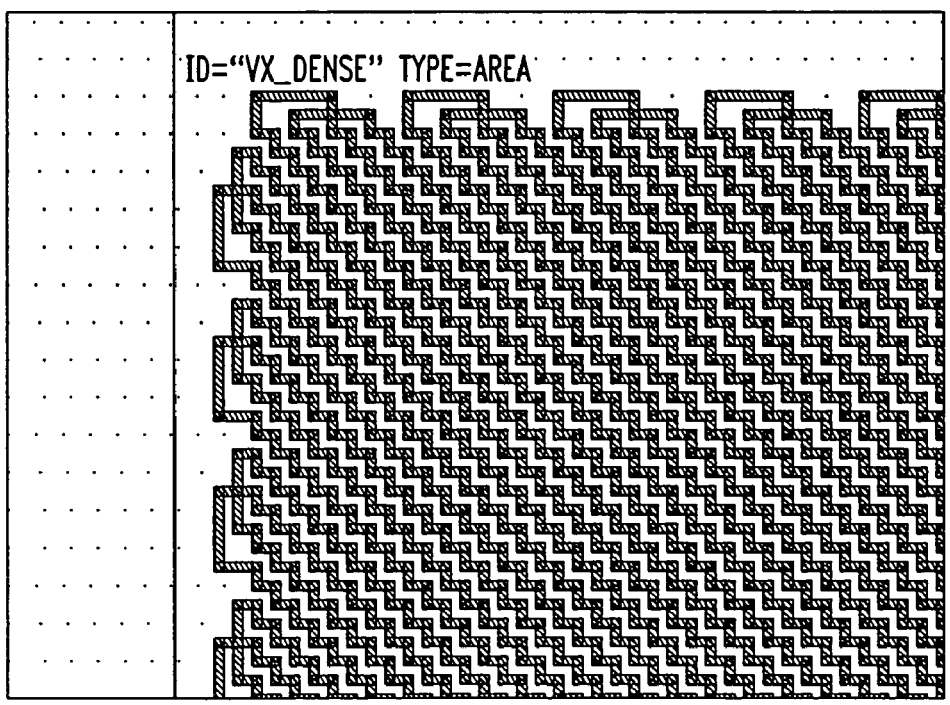
FIGS. 14-16 are enlarged details of the reticle layout of FIG. 2.
Figure 15:
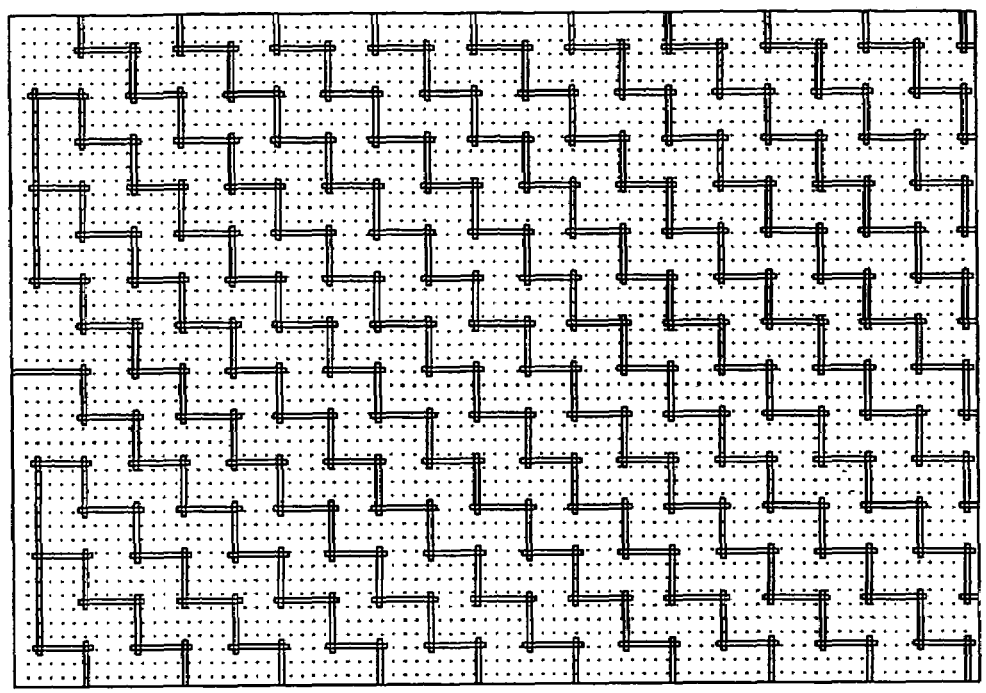
Figure 16:
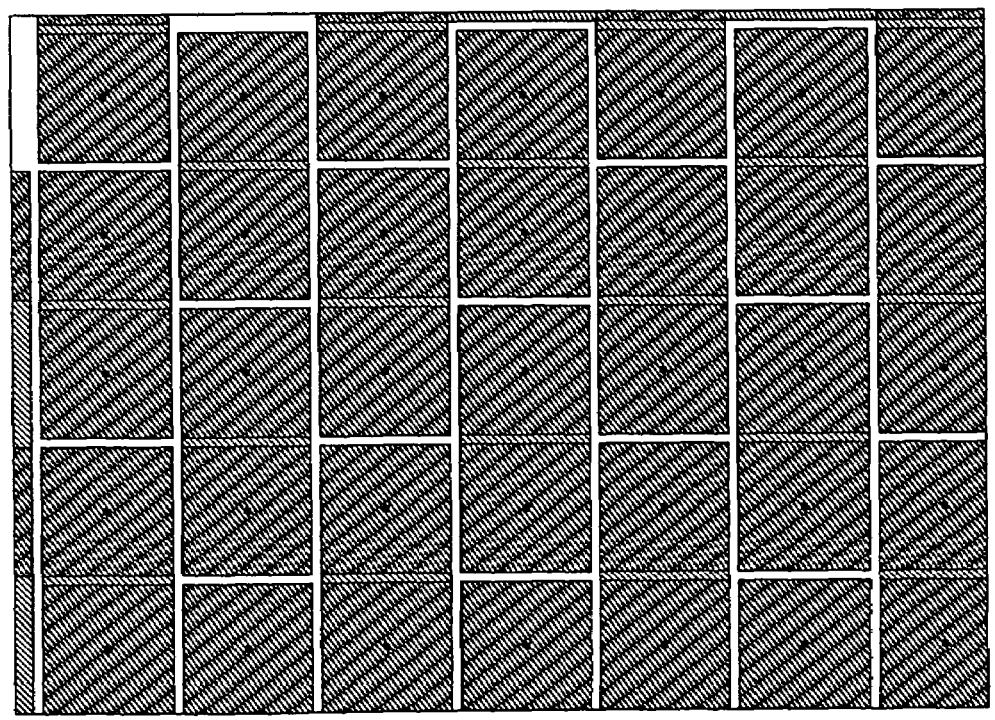

FIG. 10 shows the reticle image for the MDA and MDB type cells of FIGS. 2 and 6. This cell includes a snake comb structure with dense metal. FIG. 11 shows the reticle image for the MSA and MSB type cells of FIGS. 2 and 6. This cell includes sparse metal in a snake comb structure. FIG. 12 shows the MWA and MWB type cells of FIGS. 2 and 6. This cell includes a wide metal structure. FIG. 14 shows the reticle image for the VDA and VDB type cells of FIGS. 2 and 6. This cell includes dense via structures. FIG. 15 shows the reticle image for the VSA cell of FIGS. 2 and 6. This cell includes sparse via structures. FIG. 16 shows the reticle image for the VWA cell of FIGS. 2 and 6. This cell includes wide via structures.

Although the exemplary clone TV has a reticle with 12 sub-chips overlying 12 identical product patterns, in other examples there can be as few as a single region or partition in the product pattern. Although the example includes 12 identical product patterns in the product layers, it is possible for each cell of the clone TV to overlie a respectively different product pattern at either the same or a different vertical level.

The following observations may be made about inspection of the clone TV. For SEM or optical inspection tools, one observes the baseline defectivity in a clone TV lot. This enables one to ensure that no new or unexpected random defect modes kill the lot. An overlay analysis of observed defects vs. electrical Clone TV structure failures is performed. If all the observed defects (by SEM or optical means) are assumed to be random defects, the overlay analysis can be used to exclude random defect-driven failures from topography-related analysis for increased analysis sensitivity. If some defects are found to be topography related, defect position can be used to localize defect and confirm topography interactions. Defects found by SEM or optical inspection that do not correlate with the electrical test are assumed to be random defects. The defects found by SEM or optical inspection that do correlate with the electrical test "aggressor-victim" pairs are assumed to be three dimensional effects of interaction between layers.

For dark field inspection using a dark-field inspection tool with laser scattering to detect particles or contrast differences on the surface of a wafer, one can follow the normal recipe to detect gross topography related failures, or the sensitive recipe to localize residual TaN in the clone TV for marginal topography related failures. A "typical" (or "normal") recipe used to inspect wafers is one which catches major defect modes with a relatively low nuisance rate. Nuisance defects are either false defects (i.e. the inspection "found" a defect, but it really wasn't there) or defects which have no implication for yield and are not useful to detect (e.g., very slight film thickness differences.) A "sensitive" recipe is one which is tuned to find subtle, hard-to-detect defect modes but has a high nuisance rate. Depending on the signal to noise (S/N) ratio, excessive false defects are not necessarily a problem, because overlay analysis may be used to correlate inline information with electrical failure information.

It is usually acceptable to use the sensitive recipe in conjunction with software to match defects found on the dark field inspection with electrical failures found during E-test. This is called either "overlay analysis" or DSA, for Defect Source Analysis. If the false defect rate is "low enough" (i.e. not huge), then it is improbable that all three of the following arise in the same structure: a false defect in the structure, an unobserved true defect in that structure, and an electrical fail in that structure.

There are at least three inspection options. For example, the entire shot may be inspected in random mode. A "shot" is one exposure field of a photolithographic stepper, and is also called an "exposure field" or just "field." A wafer is patterned by exposing a pattern multiple times (in a row/column pattern) across the wafer. The field is usually bigger than a single product die design, so multiple product die are designed into a single field and exposed simultaneously. Inspecting the entire shot is the least sensitive and probably fastest option.

For Iso/dense partitioning, one can make three sets of "don't care" regions, selecting iso, dense and nominal portions of shot. A "don't care" region is a way to tell the inspection tool to ignore certain regions of each inspected die during a particular inspection. Thus, if it is desired to have separate inspection recipes for sparse (i.e. iso) areas of a die vs. dense areas of a die, one can configure the sparse recipe to put a "don't care" over dense regions, and configure the dense recipe to put a "don't care" over the sparse regions of the die. Then both inspection recipes are applied to the die on the wafer and the results are merged later in software. This method results in a higher quality overall inspection. This allows better sensitivity overall, but is slower than inspecting the entire shot.

Another option is to inspect each of the 12 sub-die in separate inspections. This allows the best sensitivity across all pattern variation. It probably involves the most time consuming setup and slowest overall throughput. Because the reticle floorplan and wafer shot pattern are the same as the product, it may be possible to perform some recipe setup before the wafers arrive.

In addition to the methods described above the exemplary method can be expanded into several areas:

1. Multiple products can be used as the underlying basis to design clone layers. A pattern density extraction can identify "corner cases" from multiple product designs. Corner cases are cases at the boundary of what a manufacturing process is known to be able to produce for functioning chips. For instance, the lowest and the highest pattern density allowed by the specification for a product describe two possible corner cases. Corner case patterns extracted (e.g., from the product specifications) for multiple products can then be copied together into a new chip design, where clone layers are applied on top of these specifically selected product samples.

Figure 17A:
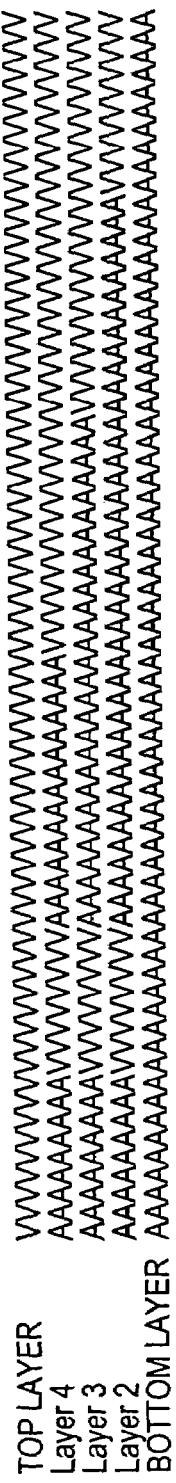
FIG. 17A is a cross section of another exemplary BEOL clone TV having a plurality of upper layers, each of which has both aggressor and victim patterns.

2. Clone layers can be mixed with product layers. As mentioned above, the clone layers are sensitive to the topography of underlying layers. Based on extractions each clone layer may be run with a different number of underlying aggressor (product) layers. FIG. 17A is a cross section of layers (side view) illustrating this concept. In FIG. 17A, the rows represent layers. The letter "A" indicates an aggressor pattern (i.e., a product pattern that may affect the clone layers). The letter "V" indicates a victim pattern in a clone layer, which may be affected by an underlying aggressor pattern.

This design is possible by cutting out certain regions of the product and placing it inside a victim clone layer, as shown in layers 2-4 of FIG. 17A. This allows optimal investigation of corner cases in all product layers in the third dimension with one mask set of clone layers only.

The partially completed TV could be pulled from the process for each A, V set to be tested and characterized. (Otherwise for a total continuous processing of all levels, the pads would be at different levels for different sub-chips.) Then the other levels on that sub-chip would are "dummied" out using appropriate masking. Alternatively, different pad levels may be used on the same subchip.

Preferably, pads are available in all victim layers and stacked on top of each other. So wafers can be pulled (from the production process) at whatever layer is desired, and whatever pads are available at that point can be measured. There is no limit to when the testing is done—either after all layers are built or after some (or at least one) of the victim layers has been processed, which is the greatest flexibility.

The TV of FIG. 17A can be tested electrically using the pads of the victim patterns on the top layer. Optionally, the processing can be stopped after any of several intermediate processing operations, and testing performed.

Figure 17B:
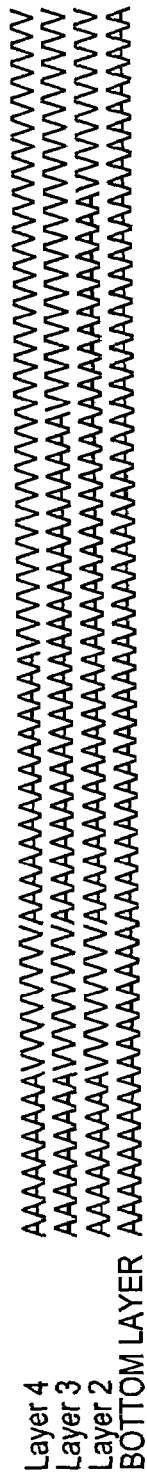
FIGS. 17B-17D show intermediate steps in the fabrication of the TV of FIG. 17A, wherein the most recently deposited layer at each intermediate step has both aggressor and victim patterns.

For example, as shown in FIG. 17B, the TV can optionally be removed from the processing line after layer 4 is formed, and electrical testing of layer 4 can be performed using the pads of the victim patterns in layer 4. The TV can then be returned to the processing line for completion of processing for layer 5.

Figure 17C:
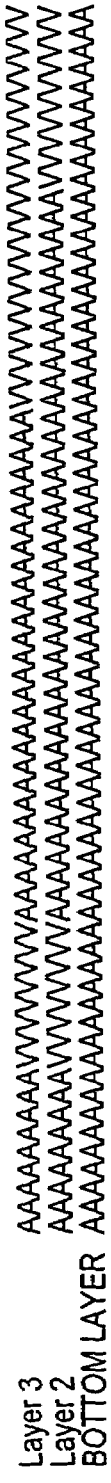

Alternatively, as shown in FIG. 17C, the TV can optionally be removed from the processing line after layer 3 is formed, and electrical testing of layer 3 can be performed using the pads of the victim patterns in layer 3. The TV can then be returned to the processing line for completion of processing (layers 4 and 5).

Figure 17D:

Further, as shown in FIG. 17D, the TV can optionally be removed from the processing line after layer 2 is formed, and electrical testing of layer 2 can be performed using the pads of the victim patterns in layer 2. The TV can then be returned to the processing line for completion of processing (layers 3-5).

Although FIGS. 17A-17D provide an example of a TV having four clone layers, any number of clone layers may be used, with pads for electrical testing at any subset of the clone layers.

These intermediate testing steps may be performed in combination. For example, electrical testing may be performed after levels 2, 3 and 5 but not 4. Testing may be performed after layers 2, 4 and 5, but not 3. Other combinations of tests are also contemplated.

3. Customized Aggressor/Victim DOE (Design of Experiment). To explore the process window, it is desirable to explore the 3-D (third dimension) layer yield impact even before the first products are available for mass production. To do so, the aggressor layers can be designed as part of the clone TV by "cloning" such product design attributes as, for instance, pattern shapes and densities, that are to be used in future products.

Figure 18:
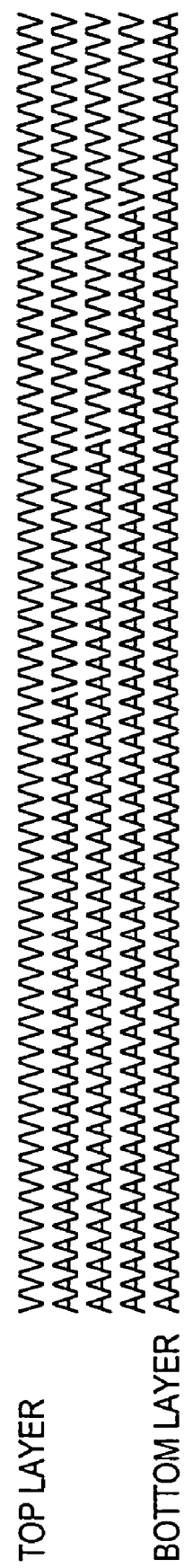
FIG. 18 is a cross section of another type of BEOL clone TV for a three dimensional yield impact design on experiment.

Such a DOE is then be assembled to a clone TV as can be shown in FIG. 18. In FIG. 18, the letter "A" indicates an aggressor 3D-DOE layer, and the letter "V" indicates a victim pattern in a clone layer. There is no limitation to the number of layers that can be mixed as aggressor and victim layers.

Figure 19:
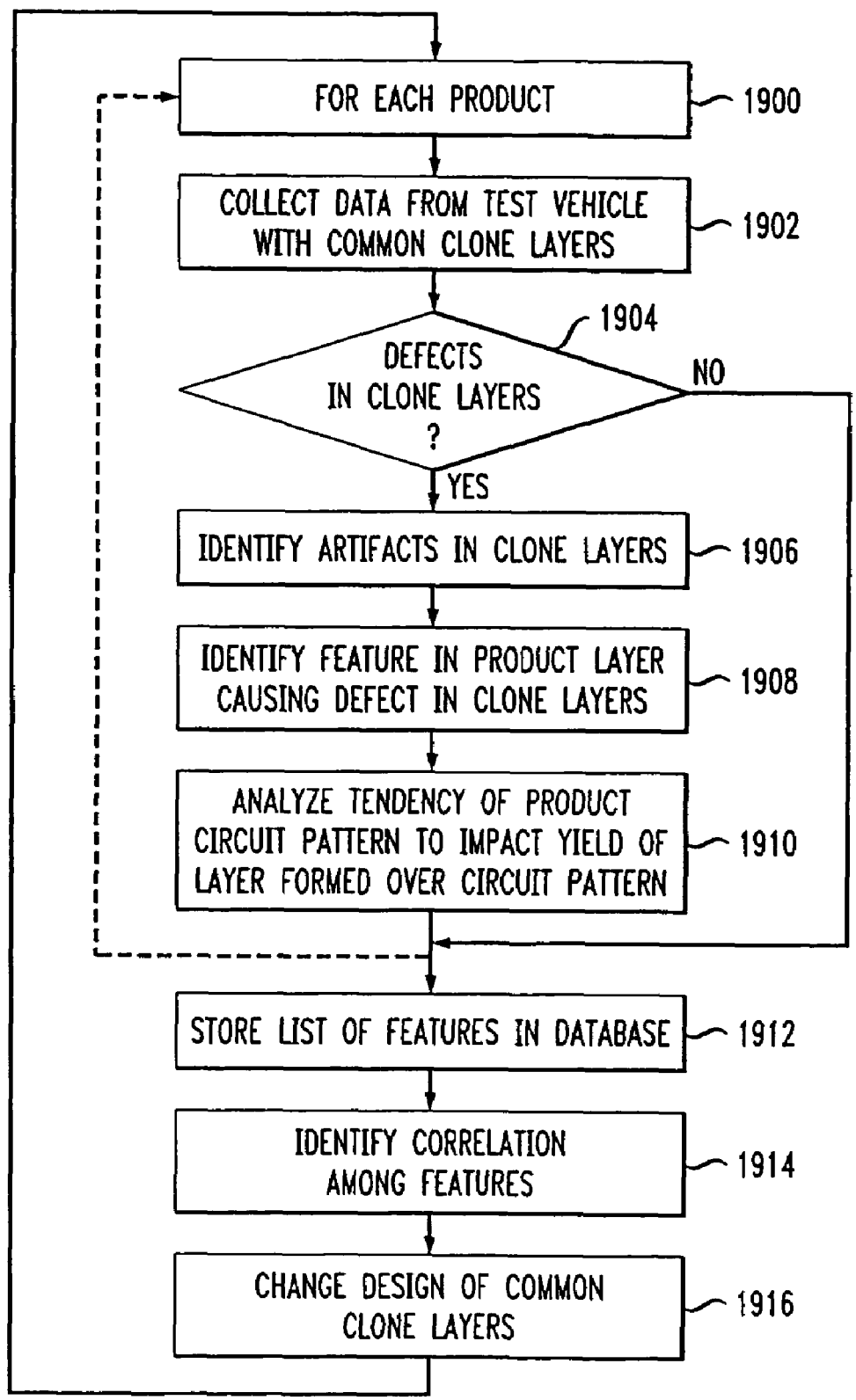
FIG. 19 is an exemplary method according to one embodiment of the invention.

FIG. 19 is a flow chart diagram of an exemplary method.

At step 1900, a loop including steps 1902-1910 is performed for each of a plurality of products.

At step 1902, data are collected from a test vehicle having a common set of clone layers that is used for each product.

At step 1904, a determination is made whether there are defects in the clone layers of the test vehicle. If no defects are found, steps 1906-1910 are skipped for this particular product.

At step 1906, the artifacts in the clone layers are identified.

At step 1908, the features in the product layer that cause the defects in the clone layers are identified.

At step 1910, the tendency of the product circuit pattern to impact the yield of the layer formed over that circuit pattern is analyzed.

At step 1912, a list of features that tend to impact the yield of layers formed over those features is stored in a database.

At step 1914, any correlation among the features is identified.

At step 1916, the correlation is fed back into the design of the common clone layers, for enhancement of the BEOL clone test vehicle.

Although the invention has been described in terms of exemplary embodiments, it is not limited thereto. Rather, the appended claim should be construed broadly, to include other variants and embodiments of the invention, which may be made by those skilled in the art without departing from the scope and range of equivalents of the invention.

What is claimed is:

1. A test vehicle, comprising:
   at least one product layer having at least one product circuit pattern thereon;
   one or more clone layers formed over the product layer, the one or more clone layers including a plurality of clone test structures, the plurality of clone test structures overlying the product circuit pattern,
   wherein the one or more clone layers have a plurality of regions, each of the regions of the one or more clone layers including a respective plurality of structures from the group consisting of clone test vehicle circuit patterns and clone test vehicle vias, wherein at least two of the regions in the one or more clone layers include clone test vehicle circuit patterns having respectively different combinations of metal density, line width and line spacing, and wherein the presence of one or more defects in the one or more clone test structures is an indicator of a tendency of the product circuit pattern to impact yield of a circuit pattern overlying the product circuit pattern in a product.

2. The test vehicle of claim 1, wherein each region of a top one of the one or more clone layers has a plurality of identical padgroups.

3. The test vehicle of claim 2, wherein each padgroup is associated with a plurality of devices under test.

4. The test vehicle of claim 1, wherein two of regions of the one or more clone layers have clone test vehicle circuit patterns that are identical to each other but offset from respective region boundaries by different distances, and the padgroups for each of the two regions are positioned in respectively different portions of the region, so as to make artifacts beneath respectively different portions of the region measurable in each of the two regions.

5. The test vehicle of claim 1, wherein the clone test vehicle circuit patterns include snakecomb structures.

6. The test vehicle of claim 1, wherein the one or more clone layers have at least three regions, including:
a first region with a medium metal density, a minimum line width and a nominal line spacing;
a second region with a maximum metal density, relatively wide lines and a minimum line spacing; and
a third region with a minimum metal density, a minimum line width, and a minimum line spacing.

7. The test vehicle of claim 1, wherein at least two of the regions in the one or more clone layers include clone test vehicle vias having respectively different combinations of metal density and via density.

8. The test vehicle of claim 7, wherein the one or more clone layers have at least three regions, including:
a first region with a relatively high metal density and a relatively high via density; a second region with a relatively sparse metal density and a relatively sparse via density; and
a third region with a relatively high metal density and a relatively sparse via density.

9. The test vehicle of claim 1, wherein the clone layers include zigzag via chains.

10. The test vehicle of claim 1, wherein the product circuit pattern is a front end of line (FEOL) product circuit pattern.

11. The test vehicle of claim 10, wherein the clone test structures include back end of line (BEOL) circuit patterns or BEOL vias.

12. A method for analyzing a circuit pattern, comprising the steps of:
(a) collecting data from a test vehicle, including:
at least one product layer having at least one product circuit pattern thereon, and
one or more clone layers formed over the product layer having a plurality of regions, each of the regions of the one or more clone layers including a respective plurality of clone test structures overlying the product circuit pattern, wherein at least two of the regions in the one or more clone layers include clone test vehicle circuit patterns having respectively different combinations of metal density, line width and line spacing;
(b) determining whether one or more defects are present in the one or more clone layers;

(c) analyzing a tendency of the product circuit pattern to impact yield of a circuit pattern overlying the product circuit pattern in a product, based on the determination of step (b); and
(d) storing results of the analyzing in a computer readable storage medium.

13. The method of claim 12, wherein:
step (b) includes identifying one or more specific artifacts in the one or more clone layers; and
step (c) includes identifying a feature or attribute of the product layer that causes the one or more artifacts to propagate into the one or more clone layers.

14. The method of claim 13, further comprising:
performing steps (a) through (c) for each of a plurality of products, each having a respective product circuit pattern, wherein the same or substantially the same clone layers are used when step (a) is performed for respectively different product circuit patterns.

15. The method of claim 14, further comprising storing a list of the identified features or attributes in a database.

16. The method of claim 15, further comprising: identifying a correlation among the identified features or attributes in the database.

17. The method of claim 16, further comprising feeding back information on the correlation to change a design of at least one of the product circuit patterns.

18. The method of claim 16, further comprising feeding back information on the correlation to change a design of the one or more clone layers.

19. The method of claim 12, wherein the product circuit pattern is a front end of line (FEOL) product circuit pattern formed by FEOL processing.

20. The method of claim 19, wherein the clone test structures include back end of line (BEOL) circuit patterns or BEOL vias.

21. In a method for fabricating a plurality of different test vehicles, the improvement comprising:
fabricating the plurality of test vehicles, so that:
each test vehicle has a respectively different product layer, each having at least one different product circuit pattern thereon;
each test vehicle has one or more clone layers over the product layer, the one or more clone layers including a plurality of clone test structures, the plurality of clone test structures overlying the product circuit pattern; and
the one or more clone layers used for each of the plurality of different test vehicles are the same or substantially the same.

22. The method of claim 21, further comprising:
determining whether one or more defects are present in the one or more clone layers of each test vehicle; and
analyzing a tendency of each product circuit pattern to impact yield of a succeeding layer to be formed over the product circuit pattern in a product, based on the determination of the presence of defects in the same or substantially the same clone layers in each test vehicle.

23. The method of claim 21, wherein the clone layers for each of the plurality of test vehicles have common structures, and respectively different clone layer length and clone layer width corresponding to a length and width of the respective product layers.

24. The method of claim 21, wherein the clone layers for each of the plurality of test vehicles are divided into a plurality of regions arranged in a common layout shared by each test vehicle, the corresponding regions in the clone layers of each test vehicle having common structures.

25. The method of claim 21, wherein the product circuit pattern is a front end of line (FEOL) product circuit pattern formed by FEOL processing.

26. The method of claim 25, wherein the clone test structures include back end of line (BEOL) circuit patterns or BEOL vias.

27. A method for analyzing a plurality of circuit patterns, comprising the steps of:
   (a) forming a first clone layer over a product layer, the product layer having a product circuit pattern, the first clone layers including a plurality of clone test structures, the plurality of clone test structures overlying the product circuit pattern;
   (b) determining whether one or more defects are present in the plurality of clone test structures of the first clone layer caused by artifacts in the product circuit pattern of the product layer;
   (c) forming a second clone layer over the first clone layer; and
   (d) determining whether one or more defects are present in the second clone layer caused by artifacts in the product layer or the first clone layer.

28. The method of claim 27, wherein the product layer and first and second clone layers are included in a test vehicle fabricated in a processing line, the method further comprising:
   removing the test vehicle from the processing line for testing after step (a); and
   returning the test vehicle to the processing line between step (b) and step (c).

29. The method of claim 27, wherein the product circuit pattern is a front end of line (FEOL) product circuit pattern formed by FEOL processing.

30. The method of claim 29, wherein the clone test structures include back end of line (BEOL) circuit patterns or BEOL vias.

* * * * *